United States Patent [19]

Torok et al.

[11] 4,034,359

[45] July 5, 1977

[54] MAGNETO-RESISTIVE READOUT OF A CROSS-TIE WALL MEMORY SYSTEM USING A PILLAR AND CONCENTRIC RING PROBE

[75] Inventors: Ernest J. Torok, St. Paul; Alan D. Kaske, Minneapolis; John A. Krawczak, Hopkins; Maynard C. Paul, Bloomington, all of Minn.

[73] Assignee: Sperry Rand Corporation, New York, N.Y.

[22] Filed: Aug. 28, 1975

[21] Appl. No.: 608,437

[52] U.S. Cl. .................... 340/174 TF; 340/174 SR
[51] Int. Cl.² ........................................ G11C 11/44
[58] Field of Search ............... 340/174 EB, 174 TF, 340/174 R, 174 SR, 168 SR

[56] References Cited

UNITED STATES PATENTS

| | | | |
|---|---|---|---|
| 3,736,419 | 5/1973 | Almasi et al. | 340/174 TF |
| 3,825,910 | 7/1974 | Carr, Jr. et al. | 340/174 TF |
| 3,906,466 | 9/1975 | Lo et al. | 340/174 TF |
| 3,909,809 | 9/1975 | Kinsner | 340/174 TF |

Primary Examiner—Marshall M. Curtis
Attorney, Agent, or Firm—Kenneth T. Grace; Thomas J. Nikolai; Marshall M. Truex

[57] ABSTRACT

A method of and an apparatus for reading out the information that is stored in the magnetizable layer of a cross-tie wall memory system is disclosed. The apparatus utilizes: a conductive pillar that is centered over and is conductively coupled to the Bloch-line position in the memory segment of the cross-tie wall in the magnetizable layer; a conductive ring that is oriented concentric to the pillar and that is conductively coupled to the magnetizable layer; and a readout device that is coupled across the pillar and ring for determining the resistance in the magnetizable layer between the pillar and ring as an indication of the existence or not of a Bloch-line in the memory segment.

4 Claims, 8 Drawing Figures

MAGNETO-RESISTIVE READOUT OF A CROSS-TIE WALL MEMORY SYSTEM USING A PILLAR AND CONCENTRIC RING PROBE

BACKGROUND OF THE INVENTION

The propagation of inverted Neel wall sections instead of magnetic bubbles in a serial access memory system was first proposed by L. J. Schwee in the publication "Proposal on Cross-Tie Wall and Bloch Line Propagation In Thin Magnetic Films," IEEE Transactions on Magnetics, MAG 8, No. 3, pp. 405–407, September, 1972. Such a memory system utilizes a ferromagnetic film of 81% Ni-19% Fe of approximately 300 angstroms (A) thick in which cross-tie walls can be changed to Neel walls and Neel walls can be changed to cross-tie walls by applying appropriate fields. Associated with the cross-tie wall is a section of inverted Neel wall that is bounded by a cross-tie on one end and a Bloch-line on the other end.

In such a cross-tie wall memory system, information is entered at one end of the serial access memory system by the generation of an inverted Neel wall section bounded by a cross-tie on one side and a Bloch-line on the other that is representative of a stored binary 1 and a non-inverted Neel wall section (i.e., the absence of a cross-tie and Bloch-line pair) that is representative of a stored binary 0, and is moved or propagated along the cross-tie wall by the successsive generation (and then the selective annihilation) of inverted Neel wall sections at successive memory cells along the cross-tie wall. In the D. S. Lo, et. al, U.S. Pat. No. 3,906,466 there is disclosed a propagation circuit for the transfer of inverted Neel wall sections at successive memory cells along the cross-tie wall. In the L. J. Schwee U.S. Pat. No. 3,868,660 and in a Naval Ordnance Laboratory Report NOLTR 73–185, L. J. Schwee, et al, there have been published some recent results of the further development of cross-tie wall memory system and of detectors for the readout of the binary information that is stored therein.

SUMMARY OF THE INVENTION

The present invention is directed toward a novel method of and a configuration for reading out the information that is stored in the magnetizable layer of a cross-tie wall memory system. The invention includes: conductively coupling a conductive pillar to the Bloch-line position in the memory segment of the cross-tie wall in the magnetizable layer; conductively coupling, concentric to the pillar, a conductive ring to the magnetizable layer; coupling an electrical signal across the opposing concentric edges of the pillar and ring; and, determining the resistance in the magnetizable layer between the pillar and ring as an indication of whether or not a Bloch-line is stored in the memory segment.

DESCRIPTION OF THE PREFERRED EMBODIMENTS

Figure 1:
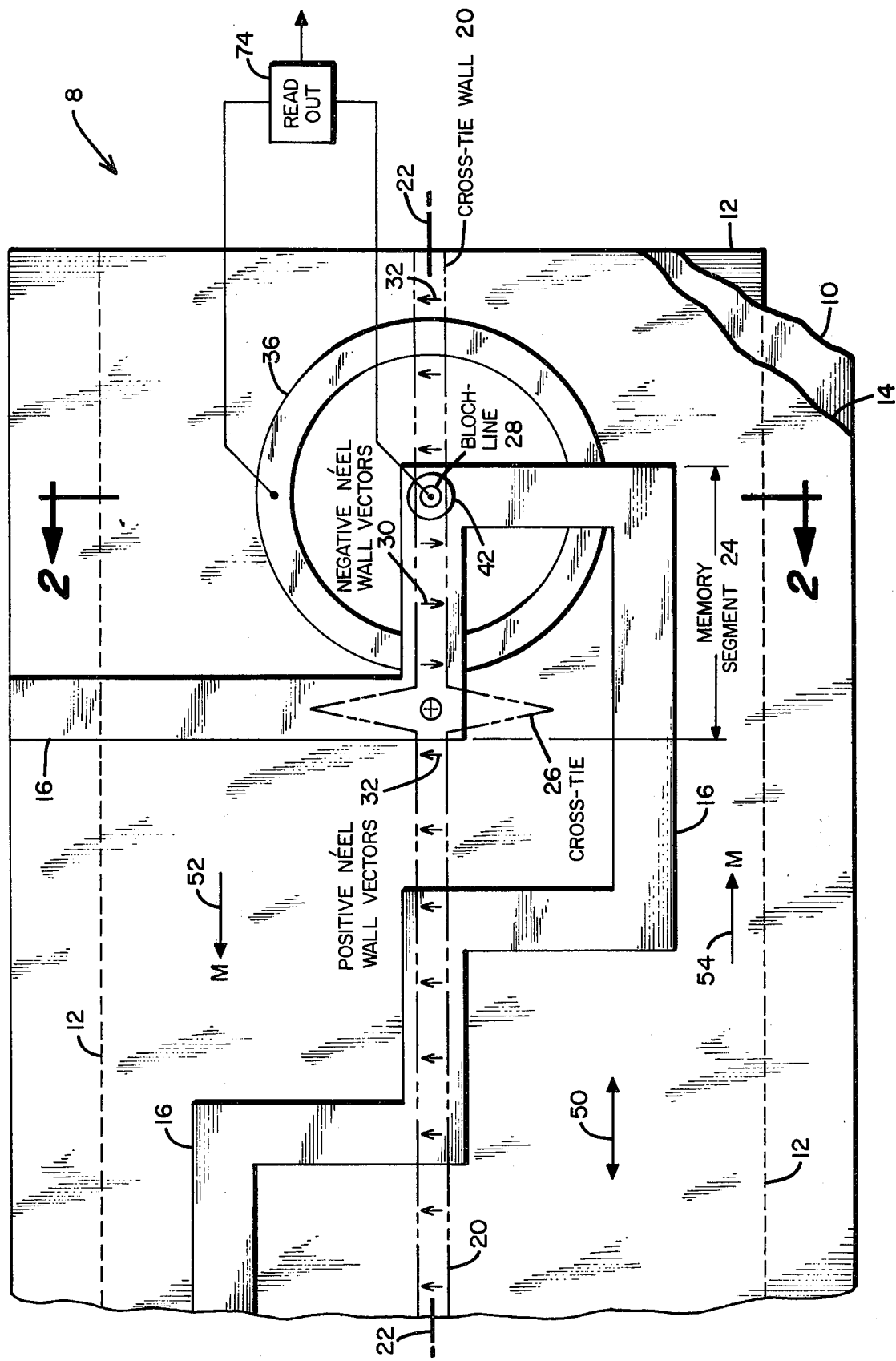
FIG. 1 is a schematic illustration of a portion of a cross-tie wall memory system illustrating, in detail, the magneto-resistive detector of the present invention.

FIG. 1 is an illustration of a portion of the prior art cross-tie memory system into which the magneto-resistive detector 8 of the present invention is incorporated. This prior art cross-tie memory system may be similar to that of the hereinabove referenced D. S. Lo, et al, U.S. Pat. No. 3,906,466 and includes a non-magnetizable, e.g., glass, substrate member 10 having a copper microstrip 12 affixed to its bottom side and a thin ferromagnetic layer 14 affixed to its top side. Affixed to the top side of layer 14 and superposed the microstrip 12 is a copper drive line 16 which is superposed layer 14, but separated therefrom by an insulative, e.g., SiO or Mylar, member 18 and affixed thereto by an insulative adhesive 19 - see FIG. 2. Drive line 16 consists of a plurality of serially-intercoupled portions, alternate ones of which define a memory cell, that are overlaid and are uniformly spaced along a cross-tie wall 20 oriented along a longitudinal axis 22.

In accordance with the hereinabove referenced D. S. Lo, et al, U.S. Pat. No. 3,906,464, there is stored in the memory segment 24 an inverse Neel wall section bounded by a cross-tie 26 on one end and a Bloch-line 28 on the other end, representative of the storage of a binary 1 in memory segment 24. Such inverted Neel wall section is represented by the negative Neel wall vectors 30 pointed in a downwardly direction while the remaining portion, i.e., the non-inverted Neel wall section of the cross-tie wall is represented by the position Neel wall vectors 32 pointed in an upwardly direction. If such representative memory segment 24 were to be redrawn for the purpose of illustrating the storage of a binary 0, the cross-tie 26, Bloch-line 28 pair illustrated in memory segment 24 would be deleted with the cross-tie wall 20 being represented by a continuation of the positive Neel wall vectors 32 throughout cross-tie wall 20 including memory segment 24.

Figure 2:
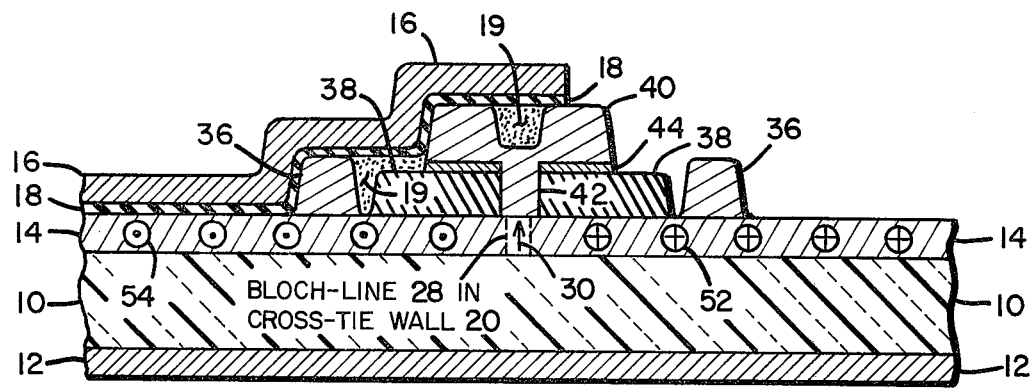
FIG. 2 is an illustration of a cross-sectional view of the detector of FIG. 1 taken along line 2—2 thereof.

With particular reference to FIG. 2 there is presented a cross-sectional view of the detector 8 of FIG. 1 taken along line 2—2 thereof for the purpose of illustrating the stacked, superposed elements of FIG. 1 and the magnetic vector representations thereof. FIGS. 1, 2 illustrate that the detector 8 illustrated therein includes a non-magnetizable, e.g., glass, substrate member 10 having a thin ferromagnetic layer 14 affixed to its top side. Conductively affixed to the top side of layer 14 and oriented concentric about Bloch-line 28 is gold ring 36. Affixed to the top side of layer 14 but separated therefrom by an insulative, e.g., SiO, member 38, is a conductive member 40 that is centered over the Bloch-line position in memory segment 24 of the cross-tie wall 20. Integral with conductive member 40 and conductively coupled to layer 14 and centered over the Bloch-line position in memory segment 24 is a copper pillar 42 that is separated from gold ring 36 and that functions to conductively couple conductive member 40 to layer 14. Thus, both conductive ring 36 and conductive member 40, via pillar 42, are conductively coupled to layer 14, all being centered about Bloch-line 28 in memory segment 24. To ensure good adhesion of conductive member 40 to insulative member 38, a thin layer, e.g., 100A(angstroms), 44 of chromium may be utilized. Next, overlaying the exposed surfaces of layer 14, ring 36, insulative member 38, and conductive member 40 and affixed thereto by an insulative adhesive 19 there is provided an insulative, e.g., SiO or Mylar, layer 18. Lastly, affixed to the surface of insulative layer 18 is the copper drive line 16 having the planar layer 18 is the copper drive line 16 having the planar conformation illustrated in FIG. 1 and, in more detail, in the hereinabove referenced D. S. Lo, et al, U.S. Pat. No. 3,906,466. Note that layer 14 has an easy axis 50 with the magnetization M thereof above the cross-tie wall 20 being aligned in a leftward direction denoted by vector 52 and below the cross-tie wall 20 being aligned in a rightward direction denoted by vector 54.

Figure 3:
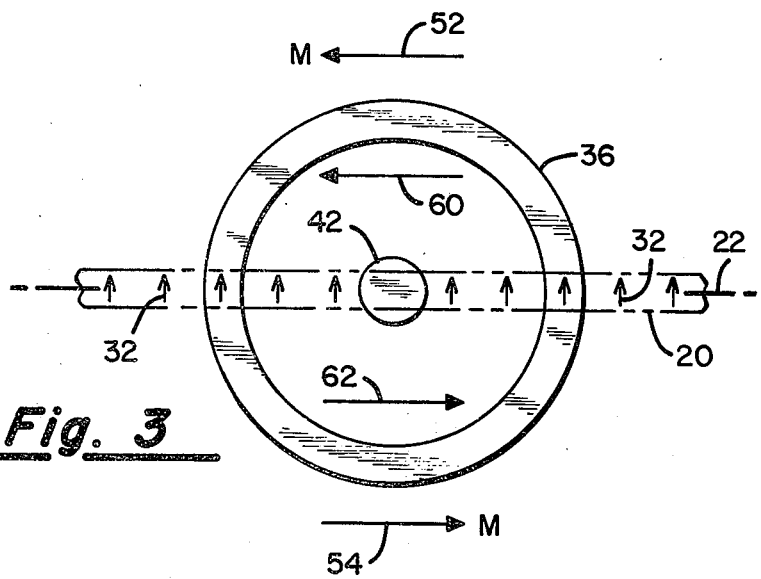
FIG. 3 is a schematic illustration of the magnetic vector orientations in the area of the memory segment of FIG. 1 with no cross-tie, Bloch-line pair stored therein.

With particular reference to FIG. 3 there is presented a schematic illustration of the magnetic vector orientations in the area of the memory segment 24 of FIG. 1 with no cross-tie, Bloch-line pair stored therein. In this condition, with no Bloch-line 28 positioned under pillar 42, with the Neel wall vectors within cross-tie wall 20 all oriented in an upwardly directed positive Neel wall vector 32 orientation, the magnetization M within the ring 36 is oriented in the vector orientations 60 and 62, parallel to the magnetization M orientations of vectors 52 and 54, respectively.

Figure 4:
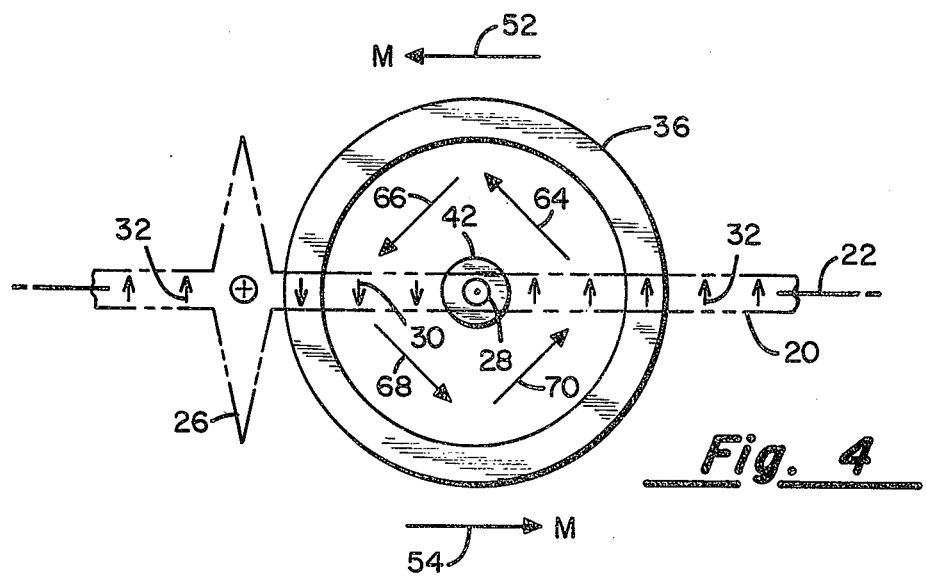
FIG. 4 is a schematic illustration of the magnetic vector orientations in the area of the memory segment of FIG. 1 with a cross-tie, Bloch-line pair stored therein.

With particular reference to FIG. 4, there is presented a schematic illustrations of the magnetic vector orientations in the area of the memory segment 24 of FIG. 1 with a cross-tie, Bloch-line pair stored therein. Under this condition, with the pillar 42 centered above Bloch-line 28, the Neel wall vectors within the inverted Neel wall section bounded by cross-tie 26 and Block-line 28 are oriented in a downwardly directed negative Neel wall vector 30 orientation while the Neel wall vectors without such memory section 24 are oriented in the upwardly directed positive Neel wall vector 32 orientation. Under this condition, with the magnetic vectors on opposite sides of Bloch-line 28, and, accordingly, pillar 42, oriented in opposite directions, there is generated about Bloch-line 28, and, accordingly, pillar 42, the magnetic vectors 64, 66, 68 70 that are oriented in a counterclockwise direction about pillar 42 and approximately 45° with respect to the longitudinal axis 22 of cross-tie wall 20.

Figure 5:
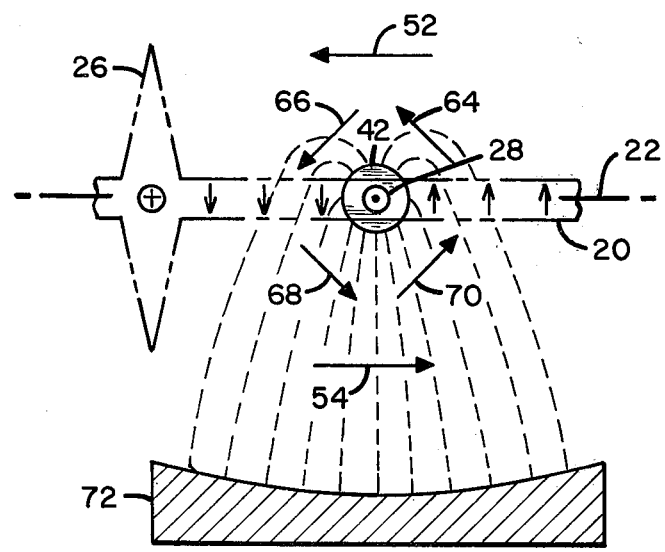
FIG. 5 is a detail of a modification of the pillar and ring of the detector of FIG. 1 and a schematic illustration of the magnetic vector orientations in the area of the memory segment with a cross-tie, Bloch-line pair stored therein.

With particular reference to FIG. 5 there is presented a detail of a modification of the pillar and ring of the detector of FIG. 1 and a schematic illustration of the magnetic vector orientation in the area of the memory segment 24 with a cross-tie, Bloch-line pair stored herein. In this embodiment, there is utilized, in place of the ring 36 of FIG. 1, a single conductive electrode member 72 positioned on one side of cross-tie wall 20 and substantially parallel to longitudinal axis 22. Note, member 72 may be spaced about Bloch-line 28 at any orientation with respect to cross-tie wall 20.

Figure 6:
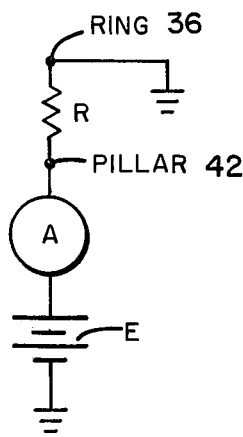
FIG. 6 is a circuit schematic of a first embodiment of the sense amplifier of FIG. 1.

With particular reference to FIG. 6 there is presented a circuit schematic of a first embodiment of the sense amplifier 74 of FIG. 1. In this configuration of sense amplifier 74, there is utilized a voltage source E that is serially coupled through an ammeter A to pillar 42. Ring 36 is, in turn, coupled to ground with the measurement of the current as indicated by the ammeter A giving an indication of the magnitude of the resistance R in that portion of layer 14 between pillar 42 and ring 36.

Figure 7:
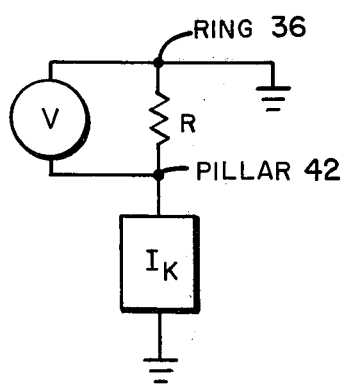
FIG. 7 is a circuit schematic of a second embodiment of the sense amplifier of FIG. 1.

With particular reference to FIG. 7 there is presented a circuit schematic of a second embodiment of the sense amplifier 74 of FIG. 1. In this configuration of sense amplifier 74, a constant current source $I_K$ is coupled to pillar 42 while ring 36 is, in turn, coupled to ground. Then, a voltmeter V is coupled across pillar 42 and ring 36, the voltage reading of which provides an indication of the resistance R of that portion of layer 14 between pillar 42 and ring 36.

THEORY OF OPERATION

Figure 8:
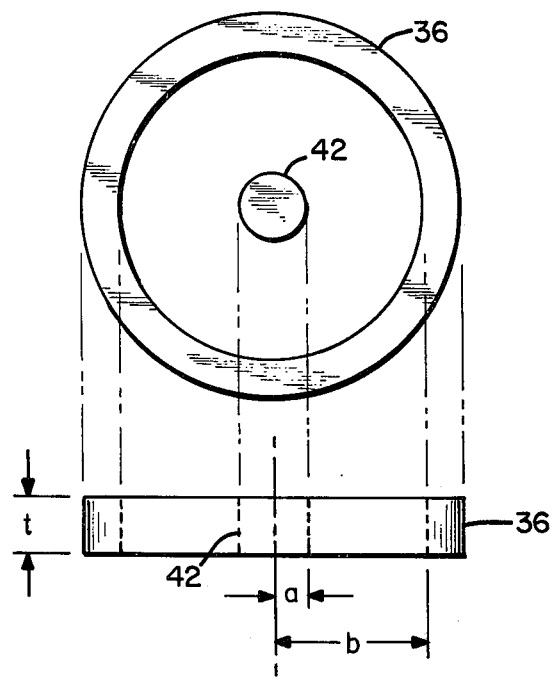
FIG. 8 is a detail of the pillar and the ring of the detector of the present invention.

With particular reference to FIG. 8 there is presented a detailed illustration of the pillar and ring of detector 8 of the present invention. In a preferred embodiment of the present invention, a pillar 42 of 0.5 mil diameter is deposited above the Bloch-line 28 position in memory segment 24, and a ring 36 of 5 mils diameter is deposited concentric to the pillar 42. The magnetization M orientation for the absence and presence of a cross-tie, Bloch-line pair are shown in FIGS. 3 and 4, respectively. Based upon the definition of resistance R, the calculated resistance between the pillar 42 and ring 36 are:

$$R_p \text{ (presence of cross-tie, Bloch-line pair)} = \frac{\rho_\perp}{2\pi t} \ln \frac{b}{a} \text{ ; and}$$

$$R_a \text{ (absence of cross-tie, Bloch-line pair)} = \frac{\rho_0}{2\pi t_1} \sqrt{1 - k^2} \ln \frac{b}{a} \text{ ;}$$

where: $\rho_0 = \frac{\rho_\parallel + \rho_\perp}{2}$ $k = \frac{\rho_\parallel - \rho_\perp}{2\rho_0}$ $\rho_\perp$ = resistivity of magneto-resistive film 14 when the magnetization M is perpendicular to the current, and $\rho_\parallel$ = resistivity of magneto-resistive film 14 when the magnetizaion M is parallel to the current.

For a design of:
$a = 0.5$ mil,
$b = 5$ mils,
$t = 300$ A, and
$\rho = 50 \times 10^{-6}$ ohm - cm, a resistance of 6.6 ohms is obtained between the pillar 42 and the ring 36. Assuming a 2% change between $\rho_\parallel$ and $\rho_\perp$, a resistance change of 1% will result between pillar 42 and ring 36 for the presence and absence of a cross-tie, Bloch-line pair. Thus, the net resistance change is:

$6.6 \times 1\% = 0.066$ ohm.

For a current of 10 mA, the output signal is:
10 mA $\times$ 0.066 ohm = 0.66 mv. As a Johnson noise for a 6.6 ohm resistance R with a 100 (MHz) bandwidth is less than 10 ($\mu$v), a signal-to-noise ratio better than 20db is expected. The magneto-resistive sensing method of the present invention allows sensing to be performed without moving the cross-tie, Bloch-line pair. This design permits considerable tolerance on the ring 36 dimensions because the resistance R between the pillar 42 and the ring 36 is dominated by the area in the vicinity of the pillar 42. Furthermore, the same layer 14 is used for both the data-carrying cross-tie wall 20 and for the magneto-resistive sensing.

What is claimed is:

1. In a cross-tie wall memory system in which bits of binary data are stored as inverted Neel wall sections, which inverted Neel wall sections are bounded by a cross-tie on one end and by a Bloch-line on the other end, in a cross-tie wall in a magnetizable layer having magneto-resistive properties and an easy axis and in which said binary data are serially propagated along said cross-tie wall by the intersecting fields provided by associated drive lines, which drive lines have memory segments that are associated with associated memory cells in said magnetizable layer in which associated ones of said bits of binary data are stored as inverted Neel wall sections, a method of magneto-resistively reading out said bits of stored binary data comprising:

conductively coupling a conductive pillar to the Bloch-line position in a memory segment of the cross-tie wall in said magnetizable layer;

conductively coupling, concentric to and separated from said conductive pillar, a conductive ring to said magnetizable layer;

coupling an electrical signal across said conductive pillar and said conductive ring;

determining the resistance in said magnetizable layer between the opposing concentric edges of said conductive pillar and said conductive ring as an indication of whether or not a Bloch-line is stored in said memory segment.

2. In a cross-tie wall memory system in which bits of binary data are stored as inverted Neel wall sections, which inverted Neel wall sections are bounded by a cross-tie on one end and by a Bloch-line on the other end, in a cross-tie wall in a magnetizable layer having magneto-resistive properties and an easy axis and in which said binary data are serially propagated along said cross-tie wall by the interacting fields provided by associated drive lines, which drive lines have memory segments that are associated with associated memory cells in said magnetizable layer in which associated ones of said bits of binary data are stored as inverted Neel wall sections, a detector for magneto-resistively reading out said bits of stored binary data comprising:

a conductive pillar conductively coupled to the Bloch-line position in a memory segment of the cross-tie wall in said magnetizable layer;

a conductive ring oriented concentric to and separated from said conductive pillar and conductively coupled to said magnetizable layer;

means coupling an electrical signal across the opposing concentric edges of said conductive pillar and said conductive ring for determining the resistance in said magnetizable layer between the opposing concentric edge of said conductive pillar and said conductive ring as an indication of whether or not a Bloch-line is stored in said memory segment.

3. In a cross-tie wall memory system in which bits of binary data are stored as inverted Neel wall sections, which inverted Neel wall sections are bounded by a cross-tie on one end and by a Bloch-line on the other end, of a cross-tie wall in a magnetizable layer having magneto-resistive properties and in which each of said bits is stored in a memory segment that is associated with an associated memory cell in said magnetizable layer, a method of magneto-resistively reading out said bits of stored binary data comprising:

conductively coupling, in the area of said cross-tie wall, a conductive pillar to said magnetizable layer;

conductively coupling, concentric to and separated from said conductive pillar, a conductive element to said magnetizable layer;

propagating a Bloch-line along said cross-tie wall and into the area of said conductive pillar, from out of one of said memory segments;

coupling an electrical signal between said conductive pillar and said conductive element;

determining the resistance in said magnetizable layer between the opposing concentric edges of said conductive pillar and said conductive element as an indication that a Bloch-line had been stored in said one memory segment.

4. In a cross-tie wall memory system in which bits of binary data are stored as inverted Neel wall sections, which inverted Neel wall sections are bounded by a cross-tie on one end and by a Bloch-line on the other end, of a cross-tie wall in a magnetizable layer having magneto-resistive properties and in which each of said bits is stored in a memory segment that is associated with an associated memory cell in said magnetizable layer, a detector for magneto-resistively reading out said bits of stored binary data comprising:

a conductive pillar conductively coupling to said magnetizable layer in the area of a Bloch-line that is positioned along the cross-tie wall in said magnetizable layer;

a conductive element radially oriented about and separated from said conductive pillar and conductively coupled to said magnetizable layer;

means coupling an electrical signal across the opposing radial edges of said conductive pillar and said conductive element for determining the resistance in said magnetizable layer between the opposing radial edges of said conductive pillar and said conductive element as an indication that a Bloch-line is positioned in the area of said conductive pillar.

* * * * *

UNITED STATES PATENT AND TRADEMARK OFFICE
CERTIFICATE OF CORRECTION

PATENT NO. : 4,034,359
DATED : July 5, 1977
INVENTOR(S) : Ernest J. Torok, et al It is certified that error appears in the above-identified patent and that said Letters Patent are hereby corrected as shown below:

IN THE PRINTED PATENT

Column 5, Line 21, "intersecting" should be --interacting--

Column 6, Line 46, "coupling" should be --coupled--.

Signed and Sealed this

Sixteenth Day of May 1978

[SEAL]

Attest:

RUTH C. MASON
Attesting Officer

LUTRELLE F. PARKER
Acting Commissioner of Patents and Trademarks